United States Patent
Choi et al.

(10) Patent No.: US 10,832,946 B1
(45) Date of Patent: Nov. 10, 2020

(54) RECESSED INTERCONNET LINE HAVING A LOW-OXYGEN CAP FOR FACILITATING A ROBUST PLANARIZATION PROCESS AND PROTECTING THE INTERCONNECT LINE FROM DOWNSTREAM ETCH OPERATIONS

(71) Applicant: International Business Machines Corporation, Armonk, NY (US)

(72) Inventors: Samuel Sung Shik Choi, Ballston Lake, NY (US); Hari Prasad Amanapu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/392,996

(22) Filed: Apr. 24, 2019

(51) Int. Cl.
*H01L 21/3105* (2006.01)
*H01L 21/768* (2006.01)
(Continued)

(52) U.S. Cl.
CPC .. *H01L 21/76808* (2013.01); *H01L 21/31055* (2013.01); *H01L 21/7684* (2013.01);
(Continued)

(58) Field of Classification Search
CPC ......... H01L 21/76808; H01L 21/31055; H01L 21/76819; H01L 21/76834; H01L 21/7684; H01L 21/76846; H01L 21/76849; H01L 21/76865; H01L 21/76877; H01L 23/5226; H01L 23/53209; H01L 2221/1063
(Continued)

(56) References Cited

U.S. PATENT DOCUMENTS 6,157,081 A 12/2000 Nariman et al.
6,624,066 B2 9/2003 Lu et al.
(Continued)

OTHER PUBLICATIONS

Mont et al., "Cobalt Interconnect on Same Copper Barrier Process Integration at the 7nm node," 2017 IEEE International Interconnect Technology Conference (IITC), IEEE, 2017, 3 pages.

*Primary Examiner* — Tong-Ho Kim
(74) *Attorney, Agent, or Firm* — Cantor Colburn LLP; Douglas Pearson (57) ABSTRACT

Embodiments of the invention are directed to a method that includes forming a dielectric region having a dielectric region top surface, wherein the dielectric top surface is substantially planar. A first interconnect structure having a substantially planar interconnect structure top surface with unintended non-planar regions is formed in the dielectric region. A reinforced planarization process is applied that includes recessing the first interconnect structure top surface to a level that is below the dielectric region top surface and the unintended non-planar region, thereby removing the unintended non-planar region and forming a second interconnect structure having a second interconnect structure top surface that is substantially planar; forming a protective cap on the second interconnect structure top surface, wherein the protective cap has a sustantially planer protective cap top surface; and recessing the dielectric region top surface to a level that is substantially planar with the protective cap top surface.

20 Claims, 5 Drawing Sheets

(51) Int. Cl.
*H01L 23/522* (2006.01)
*H01L 23/532* (2006.01)

(52) U.S. Cl.
CPC .. *H01L 21/76819* (2013.01); *H01L 21/76834* (2013.01); *H01L 21/76846* (2013.01); *H01L 21/76849* (2013.01); *H01L 21/76865* (2013.01); *H01L 21/76877* (2013.01); *H01L 23/5226* (2013.01); *H01L 23/53209* (2013.01); *H01L 2221/1063* (2013.01)

(58) Field of Classification Search
USPC .......................................................... 257/751
See application file for complete search history.

(56) References Cited

U.S. PATENT DOCUMENTS

| | | | |
|---|---|---|---|
| 6,927,113 B1 * | 8/2005 | Sahota | H01L 23/5329 257/E21.579 |
| 6,975,032 B2 | 12/2005 | Chen et al. | |
| 7,800,228 B2 | 9/2010 | Yang et al. | |
| 7,834,457 B2 | 11/2010 | Yang et al. | |
| 8,193,087 B2 | 6/2012 | Shih et al. | |
| 9,472,502 B1 | 10/2016 | Lee et al. | |
| 9,576,901 B1 | 2/2017 | Chen et al. | |
| 9,677,172 B2 | 6/2017 | Ha et al. | |
| 9,786,754 B1 | 10/2017 | Lee et al. | |
| 9,799,555 B1 | 10/2017 | Zhang et al. | |
| 9,935,051 B2 | 4/2018 | Adusumilli et al. | |
| 10,269,710 B2 | 4/2019 | Adusumilli et al. | |
| 2006/0172527 A1 | 8/2006 | Marxsen et al. | |
| 2006/0286797 A1 * | 12/2006 | Zhang | H01L 21/76864 438/659 |
| 2007/0049007 A1 | 3/2007 | Yang et al. | |
| 2009/0079077 A1 | 3/2009 | Yang et al. | |
| 2009/0294921 A1 | 12/2009 | Grillberger et al. | |
| 2015/0123279 A1 * | 5/2015 | Chi | H01L 23/53252 257/751 |
| 2017/0077256 A1 | 3/2017 | Adusumilli et al. | |
| 2018/0130702 A1 | 5/2018 | Patil et al. | |
| 2018/0197774 A1 | 7/2018 | Amanapu et al. | |

* cited by examiner

RECESSED INTERCONNET LINE HAVING A LOW-OXYGEN CAP FOR FACILITATING A ROBUST PLANARIZATION PROCESS AND PROTECTING THE INTERCONNECT LINE FROM DOWNSTREAM ETCH OPERATIONS

BACKGROUND

The present invention relates in general to fabrication methodologies and resulting structures for semiconductor devices. More specifically, the present invention is related to a recessed interconnect line having a low-oxygen (or substantially oxygen-free) cap structure configured and arranged to facilitate a robust (or reinforced) planarization process and protect the interconnect line from downstream etch operations.

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of S/D regions, as well as the deposition of metal contacts, can occur during the MOL stage to connect the elements patterned during the FEOL stage. Networks of interconnect structures (e.g., conductive lines/wires and vias) are formed above these logical and functional layers during the BEOL stage to complete the IC.

SUMMARY

Embodiments of the invention are directed to a method of forming an interconnect structure in a metallization layer of a multi-layered integrated circuit. In a non-limiting example, the method includes forming a dielectric region having a dielectric region top surface, wherein the dielectric top surface is substantially planar. A first interconnect structure is formed in the dielectric region, wherein the first interconnect structure includes a first interconnect structure top surface, wherein the first interconnect structure top surface includes an unintended non-planar region. A reinforced planarization process is applied to the dielectric region, wherein the reinforced planarization process includes recessing the first interconnect structure top surface to a level that is below the dielectric region top surface and the unintended non-planar region, thereby removing the unintended non-planar region and forming a second interconnect structure having a second interconnect structure top surface that is substantially planar; forming a protective cap on the second interconnect structure top surface, wherein the protective cap has a protective cap top surface, wherein the protective cap top surface is substantially planar; and recessing the dielectric region top surface to a level that is substantially planar with the protective cap top surface.

Embodiments of the invention are directed to a method of forming an interconnect structure in a metallization layer of a multi-layered integrated circuit. In a non-limiting example, the method includes forming a dielectric region having a dielectric region top surface, wherein the dielectric top surface is substantially planar. A first interconnect structure is formed in the dielectric region, wherein the first interconnect structure includes a first liner and a first interconnect body, wherein the first interconnect body includes a first interconnect body top surface, wherein the first interconnect body top surface includes an unintended non-planar region. A reinforced planarization process is applied that includes recessing the first interconnect body top surface to a level that is below the dielectric region top surface and the unintended non-planar region, thereby removing the unintended non-planar region and forming a second interconnect body having a second interconnect body top surface, wherein the second interconnect body top surface is substantially planar; forming a protective cap on the second interconnect body top surface, wherein the protective cap has a protective cap top surface, wherein the protective cap top surface is substantially planar; recessing a top surface of the first liner to a level that is substantially planar with the protective cap top surface; and recessing the dielectric region top surface to a level that is substantially planar with the protective cap top surface.

Embodiments of the invention are directed to a metallization layer of a multi-layered integrated circuit. In a non-limiting example, the metallization layer includes a dielectric region having a dielectric region top surface, wherein the dielectric top surface is substantially planar. An interconnect structure is in the dielectric region, wherein the interconnect structure includes an interconnect structure top surface, wherein the interconnect structure top surface is substantially planar. A protective cap is on the interconnect structure top surface, wherein the protective cap has a protective cap top surface, wherein the protective cap top surface is substantially planar. The dielectric region top surface is substantially planar with the protective cap top surface.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIGS. 1-13 depict the results of fabrication operations for forming post-CMP recessed interconnect elements having low-oxygen (or substantially oxygen-free) cap structures configured and arranged to protect the interconnect elements from downstream etch operations in accordance with aspects of the invention, in which:

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of interconnect stack, implementation of the teachings recited herein are not limited to a particular type of interconnect stack or IC architecture. Rather, embodiments of the present invention are capable of being implemented in conjunction with any other type of interconnect stack or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, semiconductor devices are used in a variety of electronic and electro-optical applications. ICs are typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and conductive interconnect layers are fabricated. More specifically, during the first portion of chip-making (i.e., the FEOL stage), the individual components (transistors, capacitors, etc.) are fabricated on the wafer. The MOL stage follows the FEOL stage and typically includes process flows for forming the contacts and other structures that communicatively couple to active regions (e.g., gate, source, and drain) of the device element. For example, the silicidation of S/D regions, as well as the deposition of metal contacts, can occur during the MOL stage to connect the individual components fabricated during the FEOL stage. In the BEOL stage, these components are connected to each other to distribute signals, as well as power and ground. The conductive interconnect layers serve as a network of pathways that transport signals throughout an IC, thereby connecting circuit components of the IC into a functioning whole and to the outside world. Because there typically is not enough room on the chip surface to create all of the necessary connections in a single layer, chip manufacturers build vertical levels of interconnects. While simpler ICs can have just a few metal layers, complex ICs can have ten or more layers of wiring.

Interconnects close to the transistors need to be small because they attach/join to the components that are themselves very small and often closely packed together. These lower-level lines, which can be referred to as local interconnects, are usually thin and short in length. Global interconnects are higher up in the structure and travel between different blocks of the circuit. Thus, global interconnects are typically thick, long, and widely separated. Connections between interconnect levels, called vias, allow signals and power to be transmitted from one layer to the next. For example, a through-silicon via (TSV) is a conductive contact that passes completely through a given semiconductor wafer or die. In multilevel IC configurations, for example, a TSV can be used to form vertical interconnections between a semiconductor device located on one level of the IC and an interconnect layer located on another level of the IC. These vertical interconnect structures include an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. In some applications, the second end of the contact structure can be connected to a contact region of a further semiconductor-based circuit element, in which case the interconnect structure in the contact level is also referred to as a local interconnect. The contact structure can include contact elements or contact plugs having a generally square-like or round shape that are formed in an interlayer dielectric (ILD) material, which in turn encloses and passivates the circuit elements.

As the critical dimensions of the circuit elements in the device level of ICs have decreased, the dimensions of the various interconnect structures (e.g., metal lines/wires, vias, contact elements, and the like) have also decreased. In some cases, the increased packing density mandates the use of sophisticated metal-containing materials in order to improve reliability and provide a sufficiently high conductivity of the individual metal lines and vias. For example, to achieve a desired level of reliability in complex metallization systems, interconnect structures can be formed from a metal (e.g., copper, cobalt, and the like) in combination with a liner/barrier layer(s) and cap layers in order to achieve the required electrical performance and to minimize electro-migration and/or surface migration failure mechanisms. The liner/barrier layer(s) and cap layers surround the particular interconnect structure (e.g., line, contact, and/or via) and serves multiple functions. For example, the liner/barrier/cap can function as a barrier to prevent metals in the interconnect structure from migrating into the surrounding ILD in which the interconnect structures are formed. Additionally, the liner/barrier/cap can provide adhesion between the metal interconnect structure and the surrounding ILD. Additionally, the liner/barrier/cap can improve reliability by stabilizing the interconnect structure to reduce the likelihood of electro-migration and/or surface migration failure mechanisms in the interconnect structure.

Interconnect structures are often formed in a stack. For example, a transistor can have a gate contact (also referred to as a CB contact) and S/D contacts (also referred to as CA contacts). The gate contact can extend vertically through the ILD material of the IC from a metal wire (i.e., an interconnect line) or via in the first BEOL to an initial metal level (referred to as the M0 level) to the gate of the transistor. The S/D contacts can extend vertically through the ILD material from metal wires (i.e., interconnect structures) or vias in the BEOL metal level to metal plugs (also referred to as trench silicide (TS) contacts), which are on the S/D regions of the transistor. A conventional copper interconnect stack fabrication process starts with the deposition of an ILD insulating material (e.g., $SiO_2$) over the transistor followed by the creation of trenches in the ILD insulating material. The trenches are positioned over the portion of the transistor (source, gate, drain) to which electrical coupling will be made. A liner/barrier material is deposited within the trench, and the remaining trench volume is filled with a conductive material (e.g., copper, cobalt, and the like) using, for example, a chemical/electroplating process, to thereby form the relevant portion of the interconnect structure stack (e.g., an interconnect line, a via, a metal plug, a contact, etc.). The excess conductive material (i.e., the overburden) is removed and planarized to form a flat surface for subsequent processing. A cap layer is deposited over the exposed top surface of the relevant portion of the interconnect stack. This process is repeated until all portions of the interconnect structure stack have been formed.

Because there are many layers in an IC wafer, each layer must be planar so that non-uniformities do not propagate throughout the layering process. Chemical mechanical planarization (CMP) is process that can be used to remove the overburden produced by the previously-described electroplating process and create flat IC wafer processing surfaces. A known CMP processes involves pouring a mixture of chemicals and abrasives, which is known as CMP slurry, on a spinning disc of special sandpaper-like material and polishing the wafer surface. The CMP slurry can include chelating agents, oxidizers, corrosion inhibitors, buffers, surfactants, and abrasives.

At the nanometer dimensions of current IC wafers, achieving uniformly flat wafer surfaces using known CMP processes is a challenge. For example, the different films that make up the IC wafer surface have different hardness, which means that they polish away at different rates. This could lead to "dishing" where the softer materials are recessed below the level of the harder materials, which cause an undesired and unintended recess profile (e.g., voids) to be present in the metallization layers and vias post-CMP. The undesired and unintended recess profile can also result from various processing conditions such as exposure of the metallization layers and vias to acidic chemistries of CMP slurry, as well as other known processing conditions, all of which can result in reduced yield, performance, and quality in ICs.

Forming metallization layers and vias from cobalt has advantages over copper when IC/transistor dimensions shrink to about a 10 nm node. These advantaged include, but are not limited to, lower resistivity and improved electro-migration performance. However, cobalt is even more sensitive than copper to the previously-described processing conditions that can lead to unintended and undesirable recess profiles (or voids) in the interconnect structures of the metallization layers and vias.

Turning now to an overview of aspects of the invention, embodiments of the invention address the problem of unintended and undesirable recess profiles in metallization layers and vias by providing interconnect elements of the metallization and via network with a low-oxygen (or substantially oxygen-free) protective cap structure configured to facilitate a robust (or reinforced) planarization process. In accordance with aspects of the invention, the protective cap structure is also configured to protect the interconnect element from downstream etch operations.

In aspects of the invention, the robust planarization process can be implementing selectively to reinforce a conventional planarization operation that has been performed while fabricating a BEOL interconnect element. Fabrication of the BEOL interconnect structure can include using a dual damascene process in which interconnect trenches are etched in a dielectric layer of the IC wafer and simultaneously overfilled with metal. A first CMP operation is used to polish down an overburden of the deposited metal in an attempt to planarize interconnect structure. After the first CMP, an undesired and unintended recess profile (or void) is present in one or more of the interconnect structures. These voids result from various processing conditions such as exposure of the interconnect structure's metal to acidic chemistries of the CMP slurry, as well as other known processing conditions.

In aspects of the invention, the robust planarization process begins by recessing a top surface of the interconnect structure below of a top surface of the dielectric layer of the IC wafer, thereby removing the voids caused by the first CMP and forming another trench the dielectric layer and above the interconnect element. A low-oxygen protective cap structure is formed within the trench and on the exposed top surface of the recessed interconnect element. In accordance with aspects of the invention, the low-oxygen protective cap structure can be formed from a metal nitride (e.g., TaN) or a dielectric (e.g., SiN, SiCN, and variants thereof). In accordance with aspects of the invention, the low-oxygen protective cap structure has an oxygen content that ranges from zero atomic percent (at %) oxygen to about 1.0 at % oxygen. Keeping the oxygen content of the protective cap structure within this range prevents the cap structure from having enough oxygen content to cause meaningful corrosion and/or diffusion of oxygen into the underlying interconnect element, particularly when the interconnect element is formed from cobalt. Oxygen that diffuses into cobalt can lead to reliability failures such as electro-migration. Additionally, if a Co-oxide material forms as a result of the diffusion, the Co-oxide can lead to an "etch-out" condition at downstream processing where a WETs process is used. As previously noted herein, forming the interconnect element from cobalt has advantages (e.g., lower resistivity, improved electro-migration performance) over copper when IC dimensions have been reduced to about a 10 nm node.

The robust planarization process continues by overfilling the above-described trenches with a fill material (e.g., an oxide such as $SiO_2$). A post-recess second CMP is applied to the overburden of the fill material, stopping substantially on the low-oxygen cap structure, thereby planarizing the structure. In accordance with aspects of the invention, the post-recess second CMP uses a selective CMP slurry configured and arrange to selectivity planarize the fill material at a faster rate than the protective cap structure, thereby stopping (or significantly slowing down) the post-recess CMP of the robust planarization process when the post-recess second CMP reaches the low-oxygen protective cap structure. Thus, in accordance with aspects of the invention, the protective cap layer is low-oxygen (or is substantially oxygen-free) and/or is less selective to the post-recess CMP slurry than the fill material. In some aspects of the invention, CMP slurry selectivity is provided by forming the fill material from an oxide and forming the protective cap structure from a nitride (e.g., a metal nitride or a nitride dielectric). In accordance with aspects of the invention, nitride films of the fill material act as a diffusion barrier layer for cobalt and as an etch stop layer for Mx+1 integration, where via's etch selectivity stops on the nitride film. In some aspects of the invention, the fill material is $SiO_2$, and the protective cap structure is SiN, SiCN, or variants thereof. In some aspects of the invention, the fill material is $SiO_2$, and the protective cap structure is a metal nitride (e.g., TaN). After the post-recess second CMP is completed, a top surface of the low-oxygen protective cap structure is substantially planar with a top surface of the IC dielectric layer in which the interconnect element is formed.

In accordance with aspects of the invention, the low-oxygen protective cap structure also protects the interconnect element from downstream etch operations, specifically the etch operations that are used to form contacts to the interconnect element. After the robust planarization operations are completed, an additional cap layer is deposited over the IC wafer (including the low-oxygen protective cap structure), and additional ILD layers are deposited on the additional cap layer. A contact trench is etched in the additional ILD and the additional cap layer, stopping on the top surface of the protective cap structure. Without the presence of the protective cap structure, the etch chemistries used to form the contact trenches would be suboptimal because the etch chemistries would have need have the additional characteristic of not damaging the interconnect element, particularly when the interconnect element is cobalt. However, the protective cap structure provided in accordance with aspects of the invention prevents the contact trench etchants from contacting the interconnect element. Thus, the contact trench etchants can be optimized for their intended purpose (forming the contact trenches) without the need to take into consideration the negative impact that the selected contact trench etchants will have on the interconnect structure.

In accordance with aspects of the invention, a contact liner/barrier is deposited in the contact trench, and a bottom portion of the liner/barrier contacts the protective cap structure. A contact structure is formed in the contact trench and over the liner/barrier. If the protective cap structure is a metal nitride (e.g., TaN), a conductive path between the interconnect structure and the contact structure is established by the contact structure contacting the portion of the protective cap structure that is over and on the top surface of the interconnect structure. If the protective cap structure is a dielectric (e.g., SiN, SiCN, and variants thereof), a conduction path between the interconnect element and the contact structure can be established by a so-called "via-pungh-through" technique that, in effect, gouges the contact structure (including the liner/barrier) through the dielectric protective cap structure such that the contact structure makes direct contact with the interconnect element. One type of gouging technique can be a wet clean etch of cobalt using acidic solutions like a dilute (1000:1 $H_2O$:HF) hydrofluoric acid. Another type of gouging technique includes the use of argon plasma sputtering from a metal deposition chamber.

Turning now to a more detailed description of aspects of the present invention, FIGS. 1-13 depict multi-layered IC structures 100 (shown in FIGS. 1-12) and a multi-layered structure 100A (shown in FIG. 13) after fabrication operations in accordance with aspects of the invention for forming a recessed interconnect line having a low-oxygen (or substantially oxygen-free) cap structure configured and arranged to facilitate a robust (or reinforced) planarization process and protect the interconnect line from downstream etch operations. The multi-layered IC wafers 100, 100A are depicted in two-dimensions (2D) extending along the y-axis and the x-axis. However, it is understood that the multi-layered ICs 100, 100A are each a three-dimensional structure that also extends along the z-axis. Accordingly, any descriptions provided herein with reference to dimensions of the multi-layered IC wafers 100, 100A that extend along the x-axis and the y-axis also include the corresponding dimension(s) that extends along the z-axis. The specifics of the dimension(s) that extends along the z-axis will depend on the specific type of feature. For example, the specific z-axis dimensions of the interconnect structures 118A, 118B, 124C, 124D (e.g., shown in FIG. 2) will depend on whether the interconnect structures 118A, 118B, 124C, 124D are implemented as lines, wires, vias, and the like.

Figure 1:
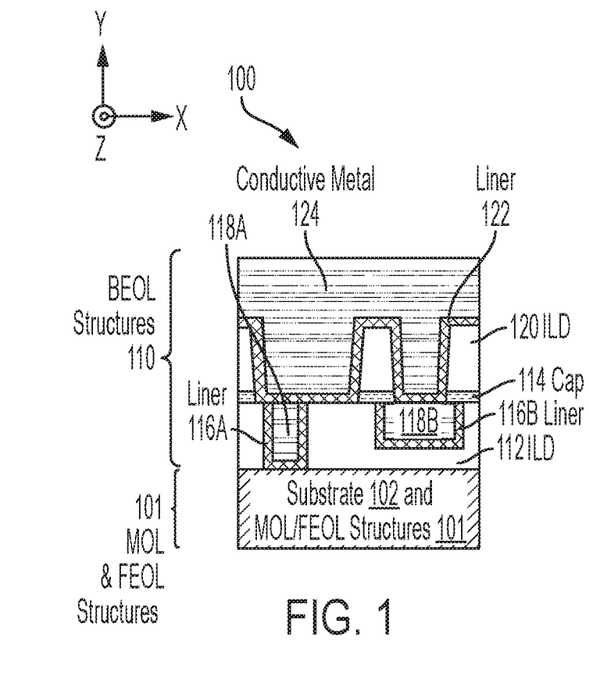
FIG. 1 depicts a cross-sectional view of a representative section of an IC after fabrication operations according to embodiments of the invention.

In FIG. 1, known fabrication operations have been used to form the multi-layered IC wafer 100. A variety of well-known fabrication operations are suitable for forming the multi-layered IC wafer 100 to the fabrication stage shown in FIG. 1. Accordingly, in the interest of brevity, such well-known fabrication operations are either omitted or described and illustrated at a high level. As shown in FIG. 1, known fabrication operations have been used to form a substrate 102 having MOL & FEOL structures 101 formed therein or thereon. Fabrication operations such as wafer preparation, isolation, and gate patterning have been used to form the FEOL structures, which can include structures such as wells, S/D regions, extension junctions, silicide regions, liners, and the like. The MOL structures include contacts and other structures that couple to the active regions (e.g., gate/source/drain) of the FEOL structures.

Referring still to FIG. 1, the BEOL interconnect structures 110 can be formed using a dual damascene process in which openings/trenches are etched in a dielectric layer (e.g., ILD 112 and/or ILD 120) and filled with metal to create metallization levels (e.g., interconnect elements 118A, 118B, 124C, 124D (shown in FIG. 3)) of the BEOL interconnect structures 110. More specifically, known fabrication operations have been used to form networks of liners/barriers 116A, 116B and interconnect structures 118A, 118B (e.g., conductive lines, conductive wires, vias, and the like) in a low-k ILD layer/region 112 as part of the BEOL structures 110 formed during initial portions of the BEOL fabrication stage. The interconnect structure 118A is an example of a relatively narrow interconnect structure, and interconnect structure 118B is an example of a relatively wide interconnect structure. In aspects of the invention, the interconnect structures 118A, 118B can be a conductive metal such as copper, cobalt, and the like. In aspects of the invention, the ILD region 112 (or the ILD region 120) can be formed from a low-k dielectric (e.g., k less than about 4), an ultra-low-k (ULK) dielectric (e.g., k less than about 2.5), tetraethoxysilane (TEOS), black diamond III (BDIII), and the like. A cap layer 114 (e.g., SiN) has been deposited over the ILD 112, the interconnect structures 118A, 118B, and top surfaces of the liners/barriers 116A, 116B. A low-k ILD region 120 has been deposited over the cap 114. Interconnect trenches (not shown) have been formed in the ILD 120 and the cap 114 then filled with a liner/barrier layer 122 and a conductive metal 124 (e.g., copper, cobalt, and the like) having an overburden region above the interconnect trenches. In aspects of the invention, the etch/liner 122 can be receded by 0-5 nm into the ILD 112 for contacts that overlap with the 112 ILD but not with the metals 116A, 118A.

The liners/barriers 116A, 116B (e.g., TiN or TaN plus an adhesion layer), the cap 114A, and portions of the liner/barrier 122 serve multiple functions. More specifically, the liners/barriers 116A, 116B function as barriers to prevent metals in the interconnect structures 118A, 118B from migrating into the ILD region 112. Additionally, the liners/barriers 116A, 116B can provide adhesion between the interconnect structures 118A, 118B and the ILD region 112. Additionally, the liners/barriers 116A, 116B, the cap layer 114, and portions of the liner/barrier layer 122 improve reliability by stabilizing the interconnect structures 118A, 118B to reduce the likelihood of electro-migration and/or surface migration failure mechanisms at the surfaces of the interconnect structures 118A, 118B.

Figure 2:
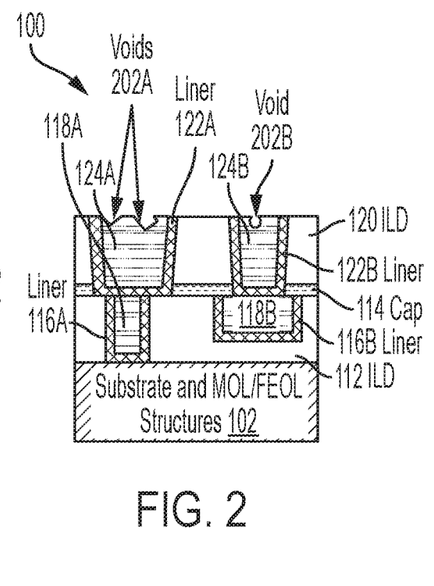
FIG. 2 depicts a cross-sectional view of a representative section of an IC after fabrication operations according to embodiments of the invention.

In FIG. 2, a first CMP operation has been applied to the conductive metal 124 (shown in FIG. 1) to remove the overburden of the conductive metal 124 and portions of the liner/barrier layer 122 in an attempt to planarize the multi-layered IC 100, thereby forming liners/barriers 122A, 122B and initial versions of the interconnect structures 124A, 124B. However, even after the application of the first CMP, which is intended to make top surfaces of the interconnect structure 124A, 124B substantially planar with a front face of the IC wafer 100 (and more specifically, the ILD 120), unintended and undesired non-uniform or non-planar regions (referred to herein as "voids") 202A, 202B can be present on and in the top surfaces of the interconnect structures 124A, 124B. The voids 202A, 202B can disrupt electrical connections, thus reducing yield, performance and quality of the IC wafer 100. The voids 202A, 202B can result from various processing conditions such as exposure of the conductive metal 124 (shown in FIG. 1) to acidic chemistries, the first CMP operations, and other known processing conditions, all of which can result in reduced yield, performance, and quality. In embodiments of the invention where the conductive metal 124 is cobalt, a cobalt implementation of the conductive metal 124 is even more sensitive (e.g., in comparison to copper) to the above-described processing conditions that lead to voids 202A, 202B in the interconnect structures 124A, 124B.

Figure 3:
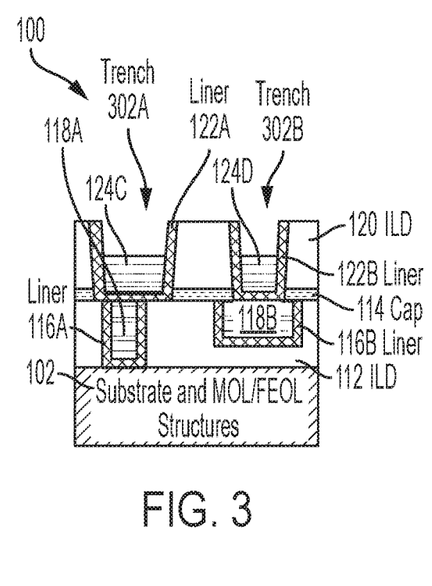
FIG. 3 depicts a cross-sectional view of the representative section of the IC after fabrication operations according to embodiments of the invention.

A robust planarization process in accordance with aspects of the invention can be implemented as depicted in FIGS. 3-6. As shown in FIG. 3, the robust planarization process includes using known fabrication operations to recess the interconnect structures 124A, 124B (shown in FIG. 2) to a level that is below the voids 202A, 202B (shown in FIG. 2), thereby removing the voids 202A, 202B and forming the recessed interconnect structures 124C, 124D and trenches 302A, 302B. In accordance with embodiments of the invention, the damaged interconnect structures 124A, 124B can be etched using a chemical etch selective to the metal used to form the recessed interconnect structures 124C, 124D. The metal-selective etch chemicals can be gaseous or wet solutions that are well known to those of ordinary skill in the art.

Figure 4:
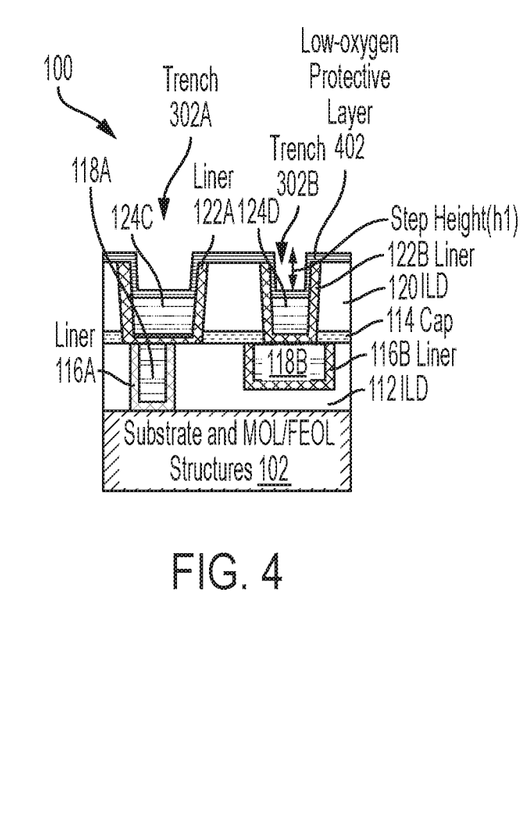
FIG. 4 depicts a cross-sectional view of the representative section of the IC after fabrication operations according to embodiments of the invention.

In FIG. 4, the robust planarization process further includes using known fabrication operations (e.g., ALD) to conformally deposit a low-oxygen (or substantially oxygen-free) protective layer 402 over the multi-layered IC 100. The low-oxygen protective layer 402 extends into the trenches 302A, 302B to define a step height (h1) in the trenches 302A, 302B. In embodiments of the invention, the low-oxygen protective layer 402 can be formed from a metal nitride (e.g., TaN) or a dielectric (e.g., SiN, SiCN, and variants thereof). In accordance with aspects of the invention, the low-oxygen (or substantially oxygen-free) protective layer 402 has an oxygen content that ranges from zero atomic percent (at %) oxygen to no more than about 1.0 at % oxygen in order to prevent the oxygen content (if any) of the protective layer 402 from corroding and/or diffusing the underlying recessed interconnect structures 124C, 124D, particularly when the recessed interconnect structures 124C, 124C are formed from cobalt in accordance with aspects of the invention. Forming the recessed interconnect structures 124C, 124D from cobalt has advantages (e.g., lower resistivity, improved electro-migration performance) over copper when dimensions of the IC wafer 100 are at about a 10 nm node.

Figure 5:
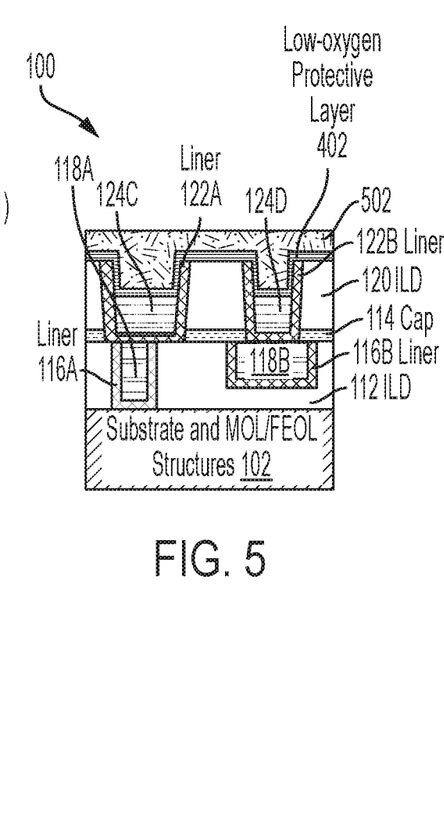
FIG. 5 depicts a cross-sectional view of the representative section of the IC after fabrication operations according to embodiments of the invention.

In FIG. 5, the robust planarization process further includes using known fabrication operations to deposit a sacrificial dielectric (e.g., an oxide such as $SiO_2$) region 502 over the multi-layered IC 100. The dielectric region 502 extends into and above the trenches 302A, 302B (shown in FIGS. 3 and 4). The portion of the region 502 that extends above the trenches 302A, 302B defines an overburden of the dielectric region 502.

Figure 6:
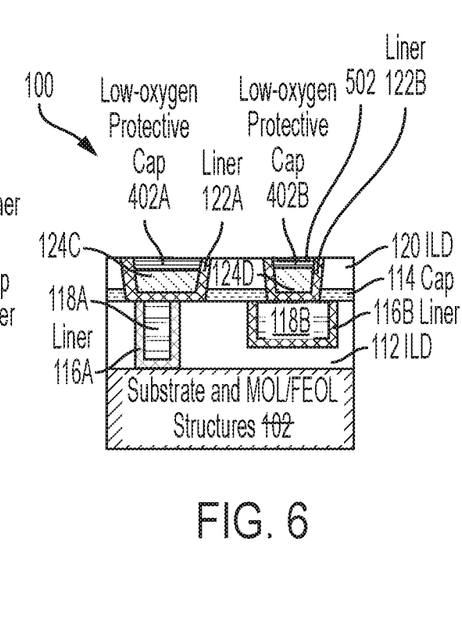
FIG. 6 depicts a cross-sectional view of the representative section of the IC after fabrication operations according to embodiments of the invention.

The robust planarization process further includes using known fabrication operations to perform a post-recess second selective-CMP operation on the IC wafer 100 shown in FIG. 5 to remove the overburden of the dielectric region 502, portions of the low-oxygen protective layer 402, portions of the liners/barriers 122A, 122B, and portions of the ILD 120. FIG. 6 depicts the results of the post-recess second selective-CMP applied to the IC wafer 100 show in FIG. 5. Referring now to elements shown in FIG. 5 and FIG. 6, in accordance with aspects of the invention, the post-recess second selective-CMP uses a selective CMP slurry configured and arrange to selectivity planarize the dielectric region 502 at a faster rate than the low-oxygen protective cap layer 402, thereby stopping (or significantly slowing down) the selective-CMP of the robust planarization process when the selective-CMP reaches any portion of the low-oxygen protective cap layer 402. Thus, in accordance with aspects of the invention, the protective cap layer 402 is low-oxygen (or is substantially oxygen-free) and/or is less selective to the selective-CMP slurry than the dielectric region 502. In some aspects of the invention, the dielectric region 502 is $SiO_2$, and the low-oxygen protective cap layer 402 can be a nitride dielectric such as SiN, SiCN, or variants thereof. In some aspects of the invention, the dielectric region 502 is $SiO_2$, and the low-oxygen protective cap layer 402 can be a metal nitride (e.g., TaN).

In an initial stage, the selective-CMP and selective CMP slurry are used to perform a bulk removal of the overburden of the dielectric region 502, stopping substantially on upper portions of the low-oxygen protective cap layer 402. A wet etch is applied to remove the upper portions of the low-oxygen protective cap layer 402. The wet etch is selective to either a metal nitride (e.g., TaN) or a nitride dielectric (e.g., SiN, SiCN, and variants thereof) depending on whether the low-oxygen protective cap layer 402 is a metal nitride or a dielectric nitride. The selective-CMP and selective CMP slurry are used a second time to remove the remaining portions of the dielectric region 502 (as well as top portions of the ILD 120 and the liners/barriers 122A, 122B), stopping substantially on lower portions of the low-oxygen protective cap layer 402 that are above the recessed interconnect elements 124C, 124D, respectively, thereby forming the low-oxygen protective caps 402A, 402B and planarizing the multi-layered IC 100 shown in FIG. 6. After the post-recess second selective-CMP of the robust planarization process has been completed, top surfaces of the low-oxygen protective caps 402A, 402B are each substantially planar with a top surface of the ILD 120 (as shown in FIG. 6) in which the liners/barriers 122A, 122B and the interconnect elements 124C, 124D have been formed.

Figure 7:
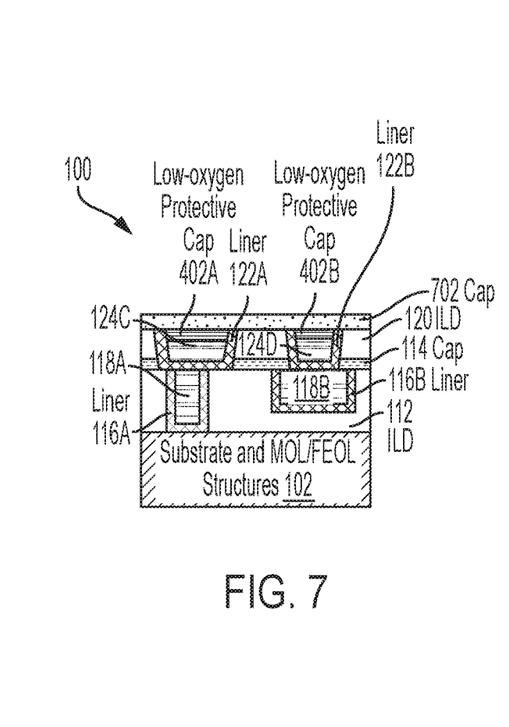
FIG. 7 depicts a cross-sectional view of the representative section of the IC after fabrication operations according to embodiments of the invention.

In FIG. 7, known fabrication operations have been used to deposit an additional cap layer 702 is deposited over the multi-layer IC wafer 100 (including the low-oxygen protective caps 402A, 402B). In embodiments of the invention, the additional cap layer 702 can be SiN.

Figure 8:
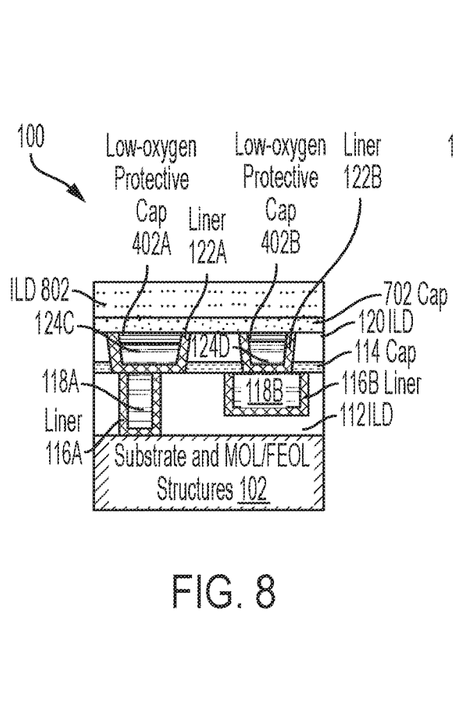
FIG. 8 depicts a cross-sectional view of the representative section of the IC after fabrication operations according to embodiments of the invention.

In FIG. 8, known fabrication operations have been used to form an additional ILD region 802 on the additional cap layer 702. In embodiments of the invention, the additional ILD region 802 can be a dielectric formed from any of the materials from which the ILD regions 112, 120 are formed. In embodiments of the invention, the ILD region 802 can be formed from the same for different material than the ILD regions 112, 120. In some embodiments of the invention, the ILD 802 can be formed from a variety of low-k dielectric materials, including, but not limited to, SiBCN, SiOCN, SiCN, and SiN.

Figure 9:
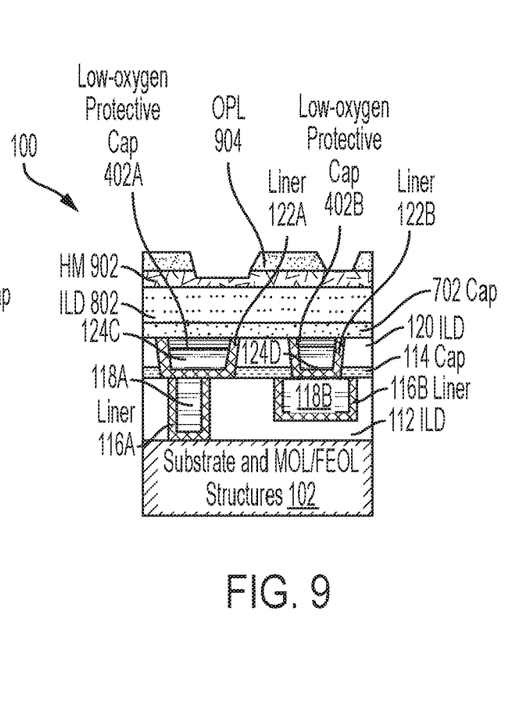
FIG. 9 depicts a cross-sectional view of the representative section of the IC after fabrication operations according to embodiments of the invention.

In FIG. 9, known fabrication operations have been used to deposit a hard mask layer 902 on the ILD region 802, and know fabrication operations have been used to deposit and pattern an organic planarization layer (OPL) 904 on the hard mask layer 902. In general, OPLs are used to fill pre-existing features, and to planarize substrates to allow for larger patterning process windows. The patterned OPL 904 defines trenches 1002A, 1002B (shown in FIG. 10). The trenches 1002A, 1002B define portions of a contact trench 1102 (shown in FIG. 11).

Figure 10:
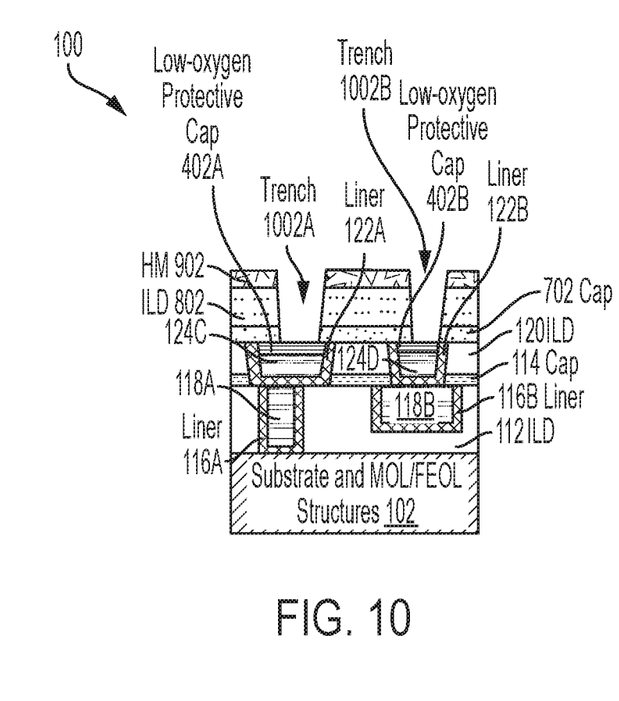
FIG. 10 depicts a cross-sectional view of the representative section of the IC after fabrication operations according to embodiments of the invention.

In FIG. 10, known fabrication operations have been used to etch through the portions of the hard mask 902, the ILD 802, and the additional cap 702 that are not covered by the patterned OPL 904 (shown in FIG. 9), thereby forming the trenches 1002A, 1002B.

Figure 11:
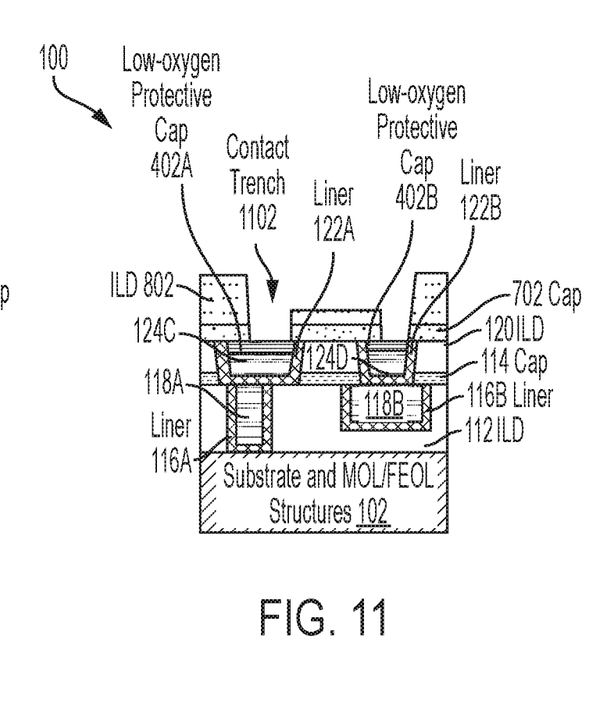
FIG. 11 depicts a cross-sectional view of the representative section of the IC after fabrication operations according to embodiments of the invention.

In FIG. 11, known fabrication operations have been used to further recess a central region of ILD 802, thereby forming a contact trench 1102. Without the presence of the low-oxygen protective caps 402A, 402B, the etch chemistries used to remove the portions of the hard mask 902, the ILD 802, and the additional cap 702 that are not covered by the patterned OPL 904 (shown in FIG. 9) would be suboptimal because the etch chemistries would need to be etchants that do not damage the non-recessed interconnect structures 124A, 124B (shown in FIG. 2), particularly when the interconnect structures 124A, 124B are cobalt. However, the protective cap structures 402A, 402B prevent the contact trench etchants from contacting the recessed interconnect structures 124C, 124D. Thus, the contact trench etchants can be optimized for their intended purpose (forming the trenches 1002A, 1002B) without the need to take into consideration the impact that the contact trench etchants will have on the interconnect structures 124C, 124D.

Figure 12:
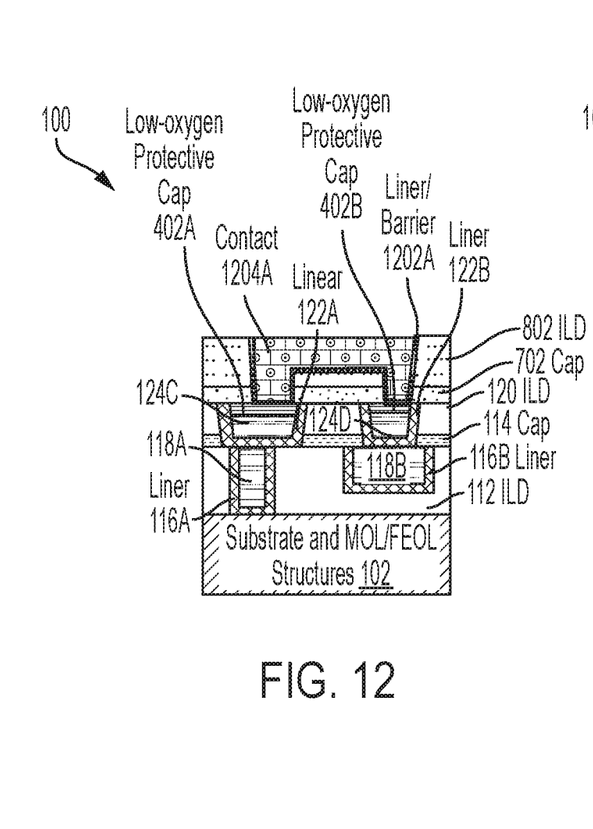
FIG. 12 depicts a cross-sectional view of the representative section of the IC after fabrication operations according to embodiments of the invention.

In FIG. 12, known fabrication operations have been used to deposit a liner/barrier 1202A and a contact 1204A in the contact trench 1102 (shown in FIG. 11). In accordance with aspects of the invention, the contact liner/barrier 1202A is deposited in the contact trench 1102 such that a bottom portion of the liner/barrier 1202A contacts the protective cap structures 124C, 124D. The contact structure 1204A is formed in the contact trench 1102 and over the liner/barrier 1202A. In accordance with aspects of the invention, the contact structure 1204A can be formed by depositing a metal film/layer (e.g., a tungsten (W) film) (not shown) that fills the contact trench 1102 and extends vertically beyond a surface of the ILD region 802 forming an overburden (e.g., a growth of a portion of the metal film beyond/above the top surface of the ILD region 802). The overburden is removed and the processing surface of the IC wafer 100 is planarized using, for example, another CMP operation. For the IC wafer 100 shown in FIG. 12, the low-oxygen protective cap structures 402A, 402B are a metal nitride (e.g., TaN), and a conduction path between the recessed interconnect structures 124C, 124C and the contact 1204A is established by the contact 1204A contacting the portions of the low-oxygen protective cap structures 402A, 402B that are over and on the top surfaces of the recessed interconnect structures 124C, 124D.

Figure 13:
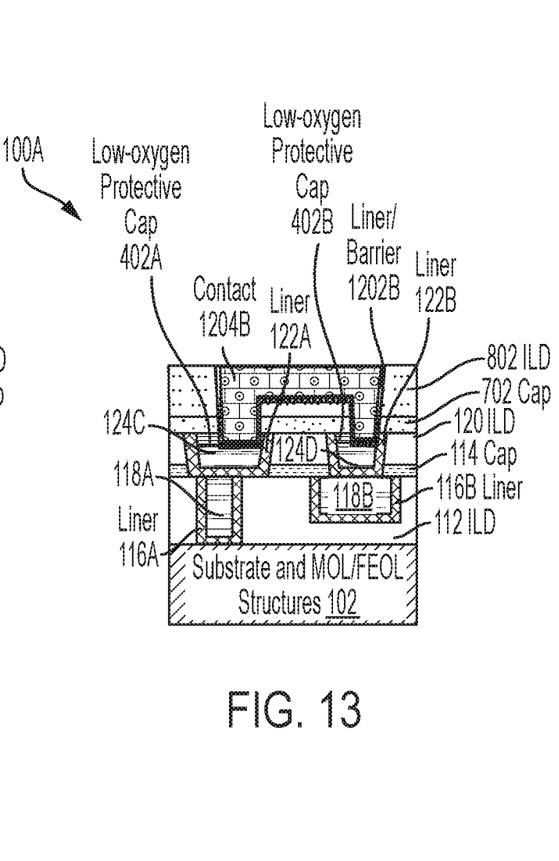
FIG. 13 depicts a cross-sectional view of the representative section of the IC after fabrication operations according to embodiments of the invention.

FIG. 13 depicts a cross-sectional view of an IC wafer 100A. The IC wafer 100A is identical to the IC wafer 100 shown in FIG. 12 except that in the IC wafer 100A the low-oxygen protective cap structures 402A, 402B are a dielectric (e.g., SiN, SiCN, and variants thereof), and a conduction path between the recessed interconnect structures 124C, 124D and the contact 1204A can be established by using a so-called "via-punch-through" technique to, in effect, gouge a liner/barrier 1202B and a contact 1204B through the dielectric low-oxygen protective cap structure 402A, 402B such that the contact 1204B makes direct contact with the recessed interconnect structures 124C, 124D. One type of known gouging technique includes applying a wet clean etch of cobalt using acidic solutions like a diluted (1000:1 $H_2O$:HF) hydrofluoric acid. Another type of known gouging technique relies on argon plasma sputtering from a metal deposition chamber.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings.

Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming an interconnect structure in a metallization layer of a multi-layered integrated circuit, the method comprising:
    forming a dielectric region having a dielectric region top surface, wherein the dielectric region top surface is substantially planar;
    forming a first interconnect structure in the dielectric region, wherein the first interconnect structure comprises a first interconnect structure top surface, wherein the first interconnect structure top surface comprises an unintended non-planar region; and
    applying a reinforced planarization process comprising:
        recessing the first interconnect structure top surface to a level that is below the dielectric region top surface and the unintended non-planar region, thereby removing the unintended non-planar region and forming a second interconnect structure having a second interconnect structure top surface, wherein the second interconnect structure top surface is substantially planar;
        forming a protective cap on the second interconnect structure top surface, wherein the protective cap has a protective cap top surface, wherein the protective cap top surface is substantially planar;
        depositing a sacrificial dielectric region over the protective cap; and
        applying a selective planarization process that planarizes and recesses the dielectric region top surface and the sacrificial dielectric region faster than it planarizes and recesses the protective cap;
        wherein the protective cap acts as a planarization stop layer to the selective planarization process when the selective planarization process reaches the protective cap top surface.

2. The method of claim 1, wherein forming the first interconnect structure comprises forming an interconnect trench in the dielectric region.

3. The method of claim 2, wherein:
    forming the first interconnect structure further comprises forming a first interconnect body region in and above the interconnect trench; and
    an overburden of the first interconnect body region comprises a portion of the first interconnect body region that is above the interconnect trench.

4. The method of claim 3, wherein forming the first interconnect structure further comprises removing the overburden of the first interconnect body.

5. The method of claim 4, wherein removing the overburden of the first interconnect body comprises applying a planarization process to the overburden of the first interconnect body.

6. The method of claim 5, wherein applying the planarization process results in the first interconnect structure comprising the first interconnect structure top surface comprising the unintended non-planar region.

7. The method of claim 1, wherein forming the protective cap on the second interconnect structure top surface comprises depositing a layer of protective cap material over the recessed first interconnect structure top surface and the dielectric region top surface.

8. The method of claim 7, wherein forming the protective cap further comprises depositing the sacrificial dielectric region over the layer of protective cap material.

9. The method of claim 8, wherein forming the protective cap further comprises:
    removing a first portion of the sacrificial dielectric region by applying a first planarization process to the first portion of the sacrificial dielectric region;
    removing a portion of the layer of protective cap material from over the dielectric region top surface; and
    removing a second portion of the sacrificial dielectric region by applying a second planarization process to the second portion of the sacrificial dielectric region, wherein the selective planarization process comprises the second planarization process.

10. The method of claim 9, wherein:
the first planarization process comprises a first chemical mechanical planarization (CMP) and a first CMP slurry that is selective to the sacrificial dielectric region over the layer of protective cap material; and
the second planarization process comprises a second CMP and a second CMP slurry that is selective to the sacrificial dielectric region over the layer of protective cap material.

11. The method of claim 10, wherein:
the sacrificial dielectric region comprises and oxide; and
the layer of protective cap material comprises a nitride.

12. The method of claim 11, wherein the nitride comprises a nitride dielectric.

13. The method of claim 11, wherein the nitride comprises a metal nitride.

14. A method of forming an interconnect structure in a metallization layer of a multi-layered integrated circuit, the method comprising:
forming a dielectric region having a dielectric region top surface, wherein the dielectric top surface is substantially planar;
forming a first interconnect structure in the dielectric region, wherein the first interconnect structure comprises a first liner and a first interconnect body-, wherein the first interconnect body comprises a first interconnect body top surface, wherein the first interconnect body top surface comprises an unintended non-planar region; and
applying a reinforced planarization process comprising:
  recessing the first interconnect body top surface to a level that is below the dielectric region top surface and the unintended non-planar region, thereby removing the unintended non-planar region and forming a second interconnect body having a second interconnect body top surface, wherein the second interconnect body top surface is substantially planar;
  forming a protective cap on the second interconnect body top surface, wherein the protective cap has a protective cap top surface, wherein the protective cap top surface is substantially planar;
  depositing a sacrificial dielectric region over the protective cap; and
  applying a selective planarization process that planarizes and recesses the dielectric region top surface, a top surface of the first liner, and the sacrificial dielectric region faster than it planarizes and recesses the protective cap;
  wherein the protective cap acts as a planarization stop layer to the selective planarization process when the selective planarization process reaches the protective cap top surface.

15. The method of claim 14, wherein:
forming the first interconnect structure comprises forming an interconnect trench in the dielectric region;
forming the first interconnect structure further comprises forming the first liner in the interconnect trench and forming the first interconnect body in and above the interconnect trench;
an overburden of the first interconnect body comprises a portion of the first interconnect body that is above the interconnect trench;
forming the first interconnect structure further comprises removing a portion of the liner and the overburden of the first interconnect body;
removing the overburden of the first interconnect body comprises applying a planarization process to the overburden of the first interconnect body; and
applying the planarization process results in the first interconnect body comprising the first interconnect body top surface comprising the unintended non-planar region.

16. The method of claim 14, wherein:
forming the protective cap on the second interconnect body top surface comprises depositing a layer of protective cap material over the recessed first interconnect body top surface and the dielectric region top surface;
forming the protective cap further comprises depositing the sacrificial dielectric region over the layer of protective cap material;
forming the protective cap further comprises:
  removing a first portion of the sacrificial dielectric region by applying a first planarization process to the first portion of the sacrificial dielectric region;
  removing a portion of the layer of protective cap material from over the dielectric region top surface; and
  removing a second portion of the sacrificial dielectric region by applying a second planarization process to the second portion of the sacrificial dielectric region, wherein the selective planarization process comprises the second planarization process;
the first planarization process comprises a first chemical mechanical planarization (CMP) and a first CMP slurry that is selective to the sacrificial dielectric region over the layer of protective cap material; and
the second planarization process comprises a second CMP and a second CMP slurry that is selective to the sacrificial dielectric region over the layer of protective cap material;
the sacrificial dielectric region comprises and oxide; and
the layer of protective cap material comprises a nitride.

17. The method of claim 16, wherein the nitride comprises a nitride dielectric.

18. The method of claim 16, wherein the nitride comprises a metal nitride.

19. A metallization layer of a multi-layered integrated circuit, the metallization layer comprising:
a dielectric region having a dielectric region top surface, wherein the dielectric top surface is substantially planar, wherein the dielectric region comprises a dielectric region planarization selectivity characteristic comprising a first selectivity to a selective planarization process used to planarize the dielectric top surface;
an interconnect structure in the dielectric region, wherein the interconnect structure comprises an interconnect structure top surface, wherein the interconnect structure top surface is substantially planar; and
a protective cap and planarization-stop (PCPS) region on the interconnect structure top surface, wherein the PCPS region has a PCPS region top surface, wherein the PCPS region top surface is substantially planar, wherein the PCPS region comprises a PCPS region planarization selectivity characteristic comprising a second selectivity to the selective planarization process used to planarize the dielectric top surface;
wherein the first selectivity is greater than the second selectivity; and
wherein the dielectric region top surface is substantially planar with the protective cap top surface.

20. The metallization layer of claim 19 further comprising:
- a cap layer on the dielectric top surface and the PCPS region;
- a top dielectric region on the cap layer; and
- a conductive contact formed in the top dielectric region and communicatively coupled to the interconnect structure.

* * * * *